(12) United States Patent
Shin

(10) Patent No.: US 7,603,091 B2
(45) Date of Patent: Oct. 13, 2009

(54) HYBRID BALUN APPARATUS AND RECEIVER COMPRISING THE SAME

(75) Inventor: Hyunchol Shin, Seoul (KR)

(73) Assignee: Integrant Technologies, Inc. (KR)

( * ) Notice: Subject to any disclaimer, the term of this patent is extended or adjusted under 35 U.S.C. 154(b) by 393 days.

(21) Appl. No.: 11/487,808

(22) Filed: Jul. 17, 2006

(65) Prior Publication Data

US 2007/0243845 A1 Oct. 18, 2007

(30) Foreign Application Priority Data

Apr. 18, 2006 (KR) ...................... 10-2006-0035056

(51) Int. Cl.
*H04B 1/18* (2006.01)
*H03H 5/00* (2006.01)
(52) U.S. Cl. .................... 455/193.1; 455/290; 455/292; 333/25
(58) Field of Classification Search ................. 455/280, 455/290, 291, 292, 193.1; 333/25–26; 336/182
See application file for complete search history.

(56) References Cited

U.S. PATENT DOCUMENTS

2003/0141953 A1* 7/2003 Haslett et al. ............... 336/182
2006/0006849 A1* 1/2006 Haslett et al. ............... 323/247

* cited by examiner

*Primary Examiner*—Nguyen Vo
(74) *Attorney, Agent, or Firm*—The Belles Group, P.C.

(57) ABSTRACT

The present invention relates to a hybrid balun apparatus and a receiver thereof. The hybrid balun apparatus comprises a passive unit, a first active unit, and a second active unit. The passive unit receives an input signal, and outputs an in-phase signal having an identical phase compared to the input signal and an inverse-phase signal having an inverse phase compared to the input signal. The first active unit compensates the in-phase signal of the passive unit corresponding to the input signal. The second active unit compensates the in-phase signal of the passive unit in response to the input signal.

10 Claims, 7 Drawing Sheets

HYBRID BALUN APPARATUS AND RECEIVER COMPRISING THE SAME

This Nonprovisional application claims priority under 35 U.S.C. § 119(a) on Patent Application No. 10-2006-0035056 filed in Korea on Apr. 18, 2006, the entire contents of which are hereby incorporated by reference.

BACKGROUND OF THE INVENTION

1. Field of the Invention

The present invention relates to a receiver, and more particularly, to a balun apparatus and a receiver comprising the same.

2. Description of the Background Art

A circuit for processing a differential signal is essential in a highly integrated receiver to reduce the effects of external noise and switching noise generated in an inside digital circuit.

Therefore, it requires an element that transforms an input signal received through an antenna to a differential signal. Such an element is a balun.

As a typical balun, a passive balun using a transformer and an active balun using a transistor amplifier were introduced.

FIG. 1 shows a passive balun circuit in accordance with the related art.

As shown in FIG. 1, the passive balun circuit according to the related art is embodied by comprising a transformer. The passive balun circuit transforms an input signal (Single-ended; $V_{IN}$) applied at the primary coil of the transformer 100 having $L_p$ inductance to an in-phase output signal ($V_{OUT+}$) and an inverse-phase output signal ($V_{OUT-}$) through the secondary coil of the transformer 100 having $L_s$ inductance.

The passive balun circuit has an advantage that small amplitude error and small phase error can be achieved for the in-phase output signal ($V_{OUT+}$) and the inverse-phase output signal ($V_{OUT-}$).

However, the power of the input signal is weakened because of an imperfect coupling coefficient (k-factor) that is a typical characteristic of the practical transformer 100 in the passive balun circuit. Thus, the power of the in-phase output signal ($V_{OUT+}$) and an inverse-phase output signal ($V_{OUT-}$) become weakened compared to that of the input signal. Usually in practice, the k-factor ranges from 0.5 to 0.8 in a real environment whereas an ideal k-factor is 1.

Therefore, the passive balun circuit cannot fully transfer the power of the input signal to the output terminals. That is, the passive balun circuit suffers the power loss due to the imperfect coupling coefficient. Consequently, the signal attenuation occurs through the balun, and it will directly degrade the noise figure and the power gain of the total receiving terminal since it is the most front-end element in the total receiving terminal.

FIG. 2 shows an active balun circuit in accordance with the related art.

Referring to FIG. 2, the active balun circuit 200 according to the related art comprises an input unit 210, a feed-back unit 220, and an output unit 230.

The input unit 210 is embodied as a differential circuit that comprises a first transistor $NM_{2a}$ and a second transistor $NM_{2b}$. And the gate terminal of the second transistor $NM_{2b}$ is connected to the feed-back unit 220. The input signal $V_{IN}$ is applied to the gate terminal of the first transistor $NM_{2a}$ and the output signals $V_{OUT+}$ and $V_{OUT-}$ are extracted differentially.

In FIG. 2, the input unit 210 is embodied as a common source circuit. However, the input unit 210 can be also embodied as a common gate circuit.

The active balun circuit 200 has drawbacks as follows. The active balun circuit 200 consumes greater power due to the transistors involved, and usually operates only in a narrow band due to the resonance circuit 220.

SUMMARY OF THE INVENTION

Accordingly, the present invention is conceived in order to solve the problems and disadvantages of the background art. It is an object of the present invention to provide a balun apparatus providing highly symmetrically balanced signals, consuming less power, having a low noise factor, having less power loss, and having high linearity.

It is another object of the present invention to provide a balun apparatus suitable for wideband operation.

It is still another object of the present invention to provide a wideband receiver having a simple structure, consuming low power, having a low noise factor, having high gain, and having high linearity, based on the said balun apparatus.

In accordance with an aspect of the present invention, a hybrid balun apparatus comprises a passive unit, a first active unit, and a second active unit. The passive unit receives an input signal, and outputs an in-phase signal having an identical phase compared to the input signal and an inverse-phase signal having an inverse phase compared to the input signal. The first active unit compensates the in-phase output signal of the passive unit corresponding to the input signal. The second active unit compensates the inverse-phase output signal of the passive unit in response to the input signal. The first active unit and the second active unit are voltage amplifiers to generate the compensating signals.

In accordance with another aspect of the present invention, a receiver comprises a passive unit, a first active unit, and a second active unit. The passive unit comprises a primary coil and a secondary coil. An input signal is applied to the primary coil. The secondary coil outputs an in-phase signal and an inverse-phase signal through an in-phase output terminal and an inverse-phase output terminal, respectively, in response to the input signal applied to the primary coil. Herein, the in-phase signal has an identical phase compared to the input signal, and the inverse-phase signal has an inverted phase compared to the input signal. The first active unit comprises a first transistor for outputting an in-phase compensating signal having an identical phase compared to the in-phase signal in response to the input signal. The second active unit comprises a second transistor for outputting an inverse-phase compensating signal having an identical phase compared to the inverse-phase signal in response to the input signal.

The first transistor may be configured as a source-follower amplifier, and the second transistor may be configured as a common-source amplifier.

The first active unit and the second active unit may be combined to be a single differential amplifier that can differentially amplify the input signal to create the in-phase and inverse-phase compensating signals.

The secondary coil may be tapped in its center terminal.

The in-phase signal output terminal of the secondary coil and the output terminal of the first transistor may be connected to the in-phase output terminal, and the inverse-phase signal output terminal of the secondary coil and the output terminal of the second transistor may be connected to the inverse-phase output terminal.

In accordance with still another aspect of the present invention, a receiver comprises a hybrid balun apparatus.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Preferred embodiments of the present invention will be described in a more detailed manner with reference to the drawings.

Hereinafter, a balun apparatus in accordance with the present invention and a receiver comprising the same will be described in detail with reference to the drawings in accordance with an embodiment of the present invention.

Figure 1:
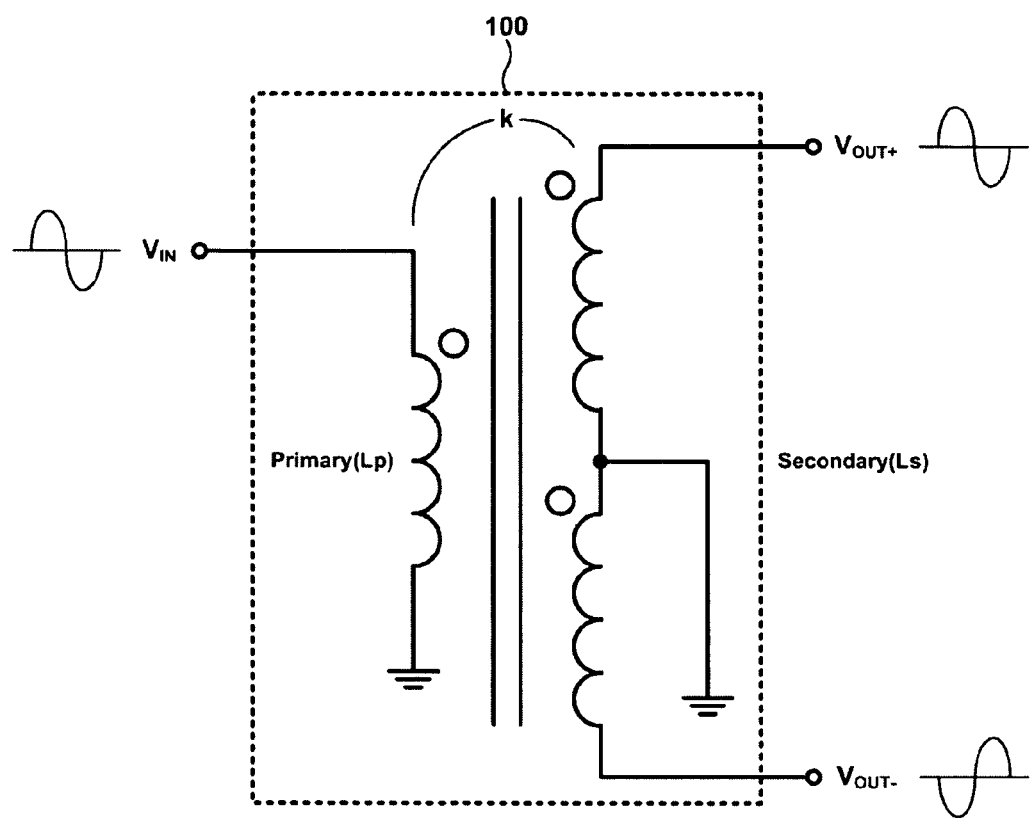
FIG. 1 illustrates a passive balun circuit in accordance with the related art.
Figure 2:
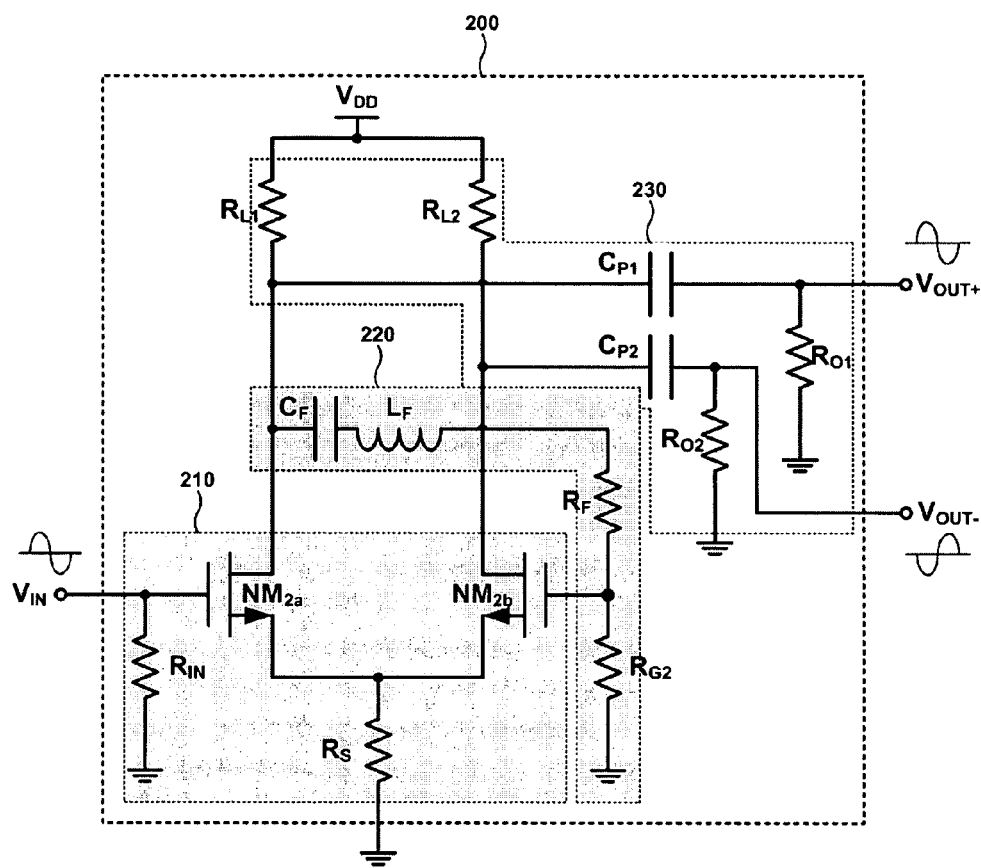
FIG. 2 illustrates an active balun circuit in accordance with the related art.
Figure 3:
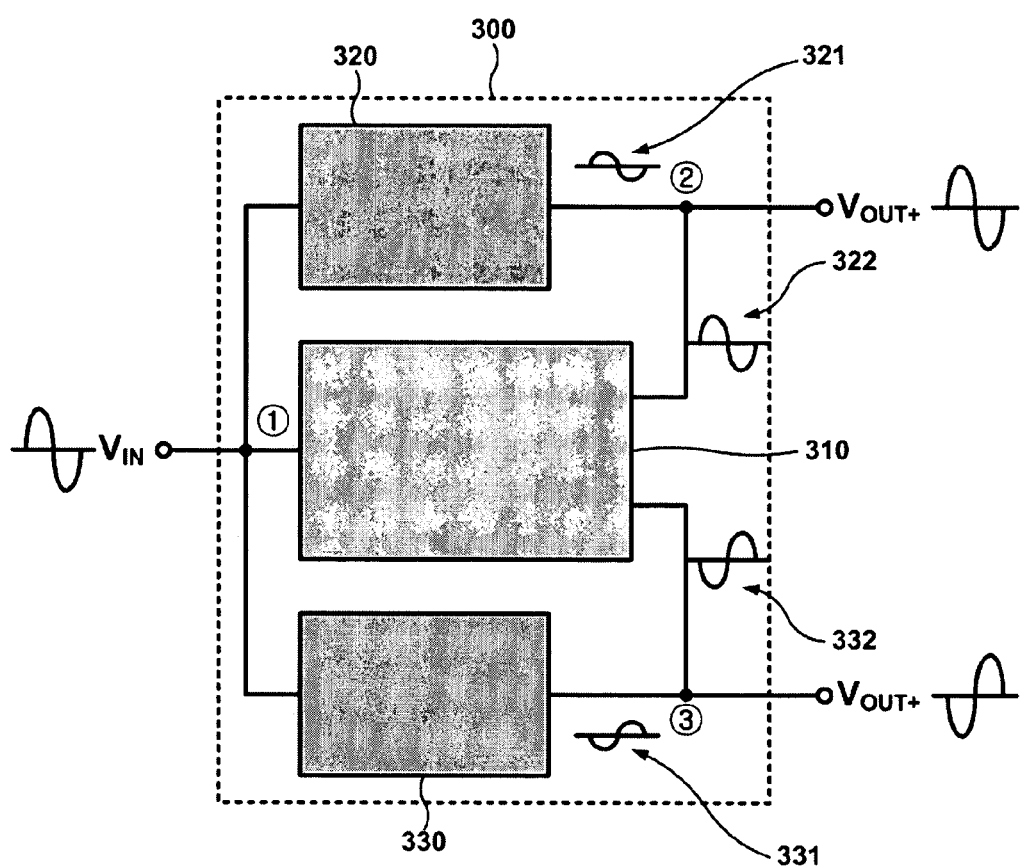
FIG. 3 illustrates a hybrid balun apparatus in accordance with an embodiment of the present invention.

FIG. 3 is a block diagram illustrating a hybrid balun in accordance with an embodiment of the present invention.

As shown in FIG. 3, the hybrid balun according to the present embodiment comprises a passive unit 310, a first active unit 320 and a second active unit 330.

The input terminal of the passive unit 310 is connected to a first node ①, the in-phase output terminal of the passive unit 310 is connected to a second node ②, and the inverse-phase output terminal of the passive unit 310 is connected to a third node ③.

The input terminal of the first active unit 320 is connected to a first node ①, and the output terminal of the first active unit 320 is connected to a second node ②.

The input terminal of the second active unit 330 is connected to a first node ①, and the output terminal of the second active unit 330 is connected to a third node ③.

An input signal (single-ended: $V_{IN}$) is applied to a first node ①. An in-phase signal $V_{OUT+}$ is taken at a second node ②, and an inverse-phase output signal $V_{OUT-}$ is taken at a third node ③.

The passive unit 310 receives the input signal $V_{IN}$ and outputs an in-phase signal 322 that has an identical phase compared to the input signal $V_{IN}$.

The first active unit 320 receives the input signal $V_{IN}$ and outputs an in-phase compensating signal 321 that has an identical phase compared to the input signal $V_{IN}$.

The in-phase compensating signal 321 is a signal for compensating the loss of the in-phase signal 322 caused by the passive unit 310. The in-phase compensating signal 321 has an identical phase and different amplitude compared to the in-phase signal 322.

According to the structure described above, the in-phase output signal $V_{OUT+}$ is formed by adding the in-phase signal 322 of the passive unit 310 applied to a second node ② and the in-phase compensating signal 321 of the first active unit 320 applied to a second node ②.

The passive unit 310 receives the input signal $V_{IN}$ and outputs an inverse-phase signal 332 that has an inversed phase compared to the input signal $V_{IN}$.

The second active unit 330 receives an input signal $V_{IN}$ and outputs an inverse-phase compensating signal 331 having an inversed phase compared to the input signal $V_{IN}$.

The inverse-phase compensating signal 331 is a signal for compensating the loss of the inverse-phase signal 332 caused by the passive unit 310. The inverse-phase compensating signal 331 has an identical phase and different amplitude compared to the inverse-phase signal 332.

According to the structure described above, the inverse-phase output signal $V_{OUT-}$ is formed by adding the inverse-phase signal 332 of the passive unit 310 applied to a third node ③ and the inverse-phase compensating signal 331 of the second active unit 330 applied to a third node ③.

That is, the first active unit 320 and the second active unit 330 behaves as a balanced circuit that simultaneously receives the input signal $V_{IN}$, differentially amplifies them and outputs the in-phase compensating signal 321 and the inverse-phase compensating signal 331.

The internal circuits of the passive unit 310, the first active unit 320 and the second active unit 330 will be described in detail with reference to FIGS. 4A through 4C.

Figure 4A:
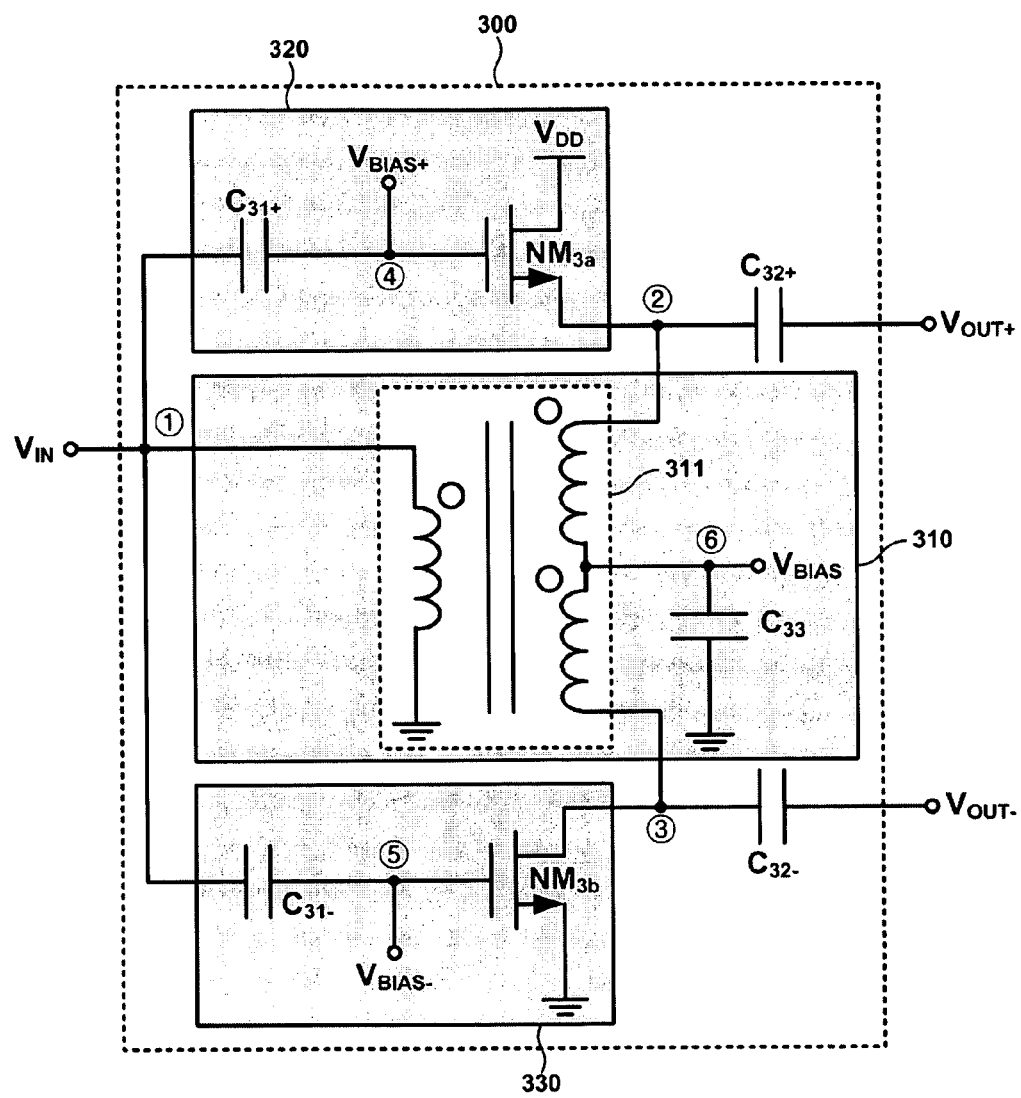
FIGS. 4A through 4C show the hybrid balun apparatus of FIG. 3 for describing circuits and operations thereof.
Figure 4B:
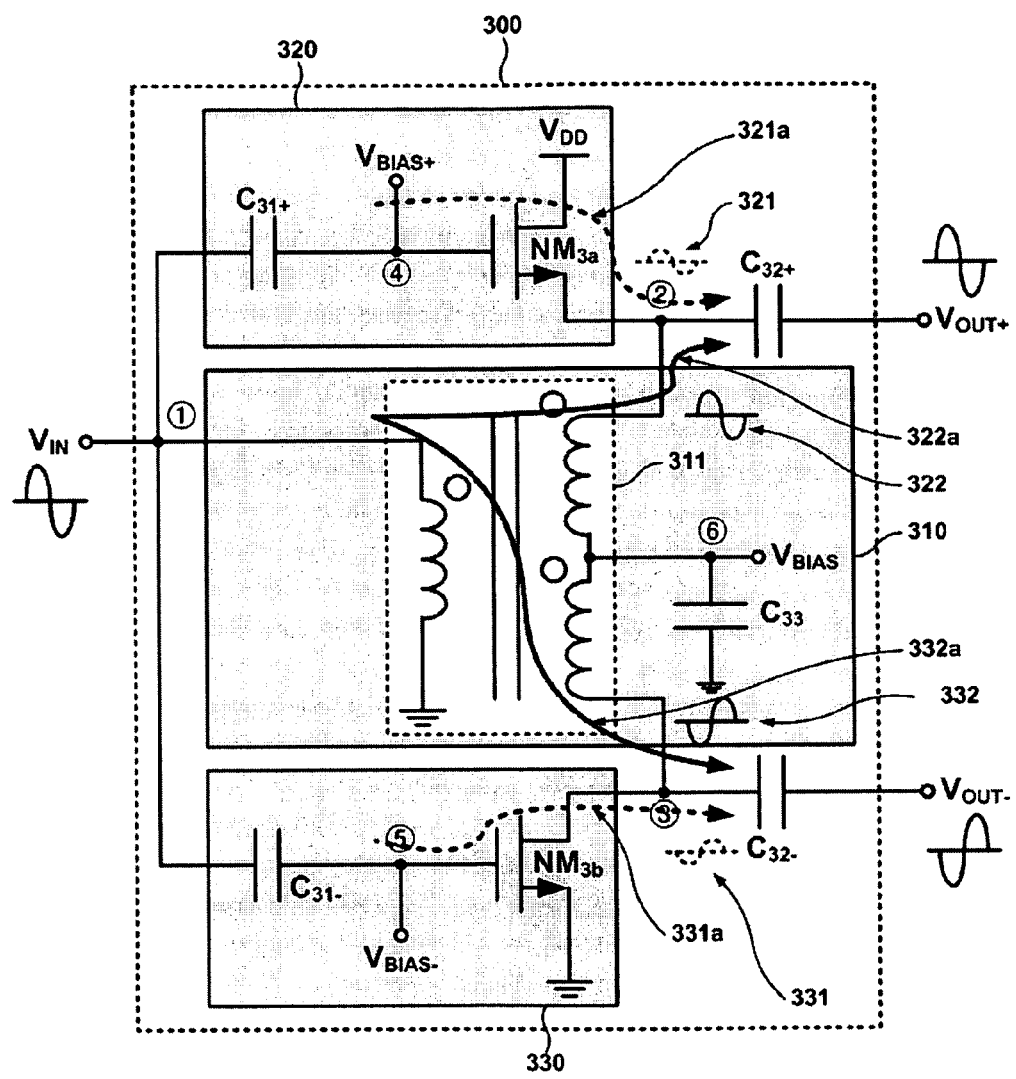
Figure 4C:
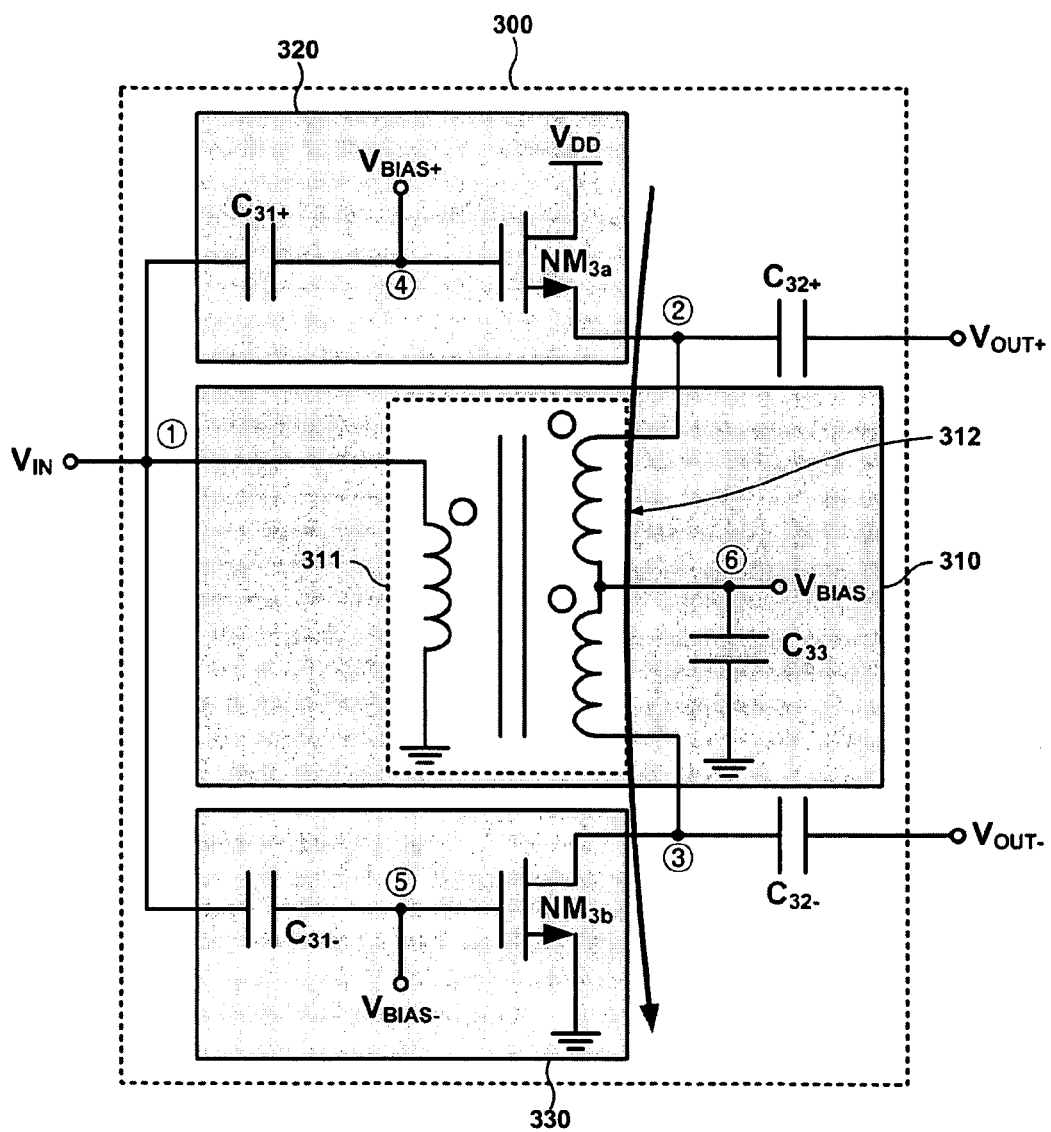

FIGS. 4A through 4C illustrate a hybrid balun apparatus in accordance with an embodiment of the present invention.

As shown in FIG. 4A, the hybrid balun apparatus according to the present embodiment includes a passive unit 310, a first active unit 320 and a second active unit 330.

Hereinafter, the structure of the hybrid balun apparatus 300 according to the present embodiment will be described.

The passive unit 310 comprises a transformer 311 and a fifth capacitor $C_{33}$ for bypassing AC (alternating current) signal.

The transformer 311 comprises a primary coil and a secondary coil. A center tap terminal is formed at the middle of the second coil for balanced output signals.

The first active unit 320 comprises a first transistor $NM_{3a}$ and a first capacitor $C_{31+}$.

The second active unit 330 comprises a second transistor $NM_{3b}$ and a second capacitor $C_{31-}$.

The hybrid balun apparatus 300 comprises a third capacitor $C_{32+}$ for removing the DC (direct current) component of the in-phase output signal $V_{OUT+}$, a fourth capacitor $C_{32-}$ for removing the DC component of the inverse-phase output signal $V_{OUT-}$, and a fifth capacitor $C_{33}$ for bypassing AC component from the tap terminal of the transformer 311 to the ground.

Hereinafter, the connecting relations of constitutional elements in the hybrid balun apparatus 300 according to the present embodiment will be described.

The one end of the primary coil of the transformer 311 is connected to a first node ①, and the other end of the primary coil is connected to the ground. The in-phase output terminal of the secondary coil of the transformer 311 is connected to a second node ②, and an inverse-phase output terminal of the secondary coil is connected to a third node ③. The center tap terminal of the inverse-phase output terminal is connected to a sixth node ⑥.

The one end of the fifth capacitor $C_{33}$ is connected to a sixth node (, and the other end of the fifth capacitor C33 is connected to the ground.

The one end of the first capacitor C31+ is connected to a first node (, and other end of the first capacitor C31+ is connected to a fourth node (.

The gate terminal of the first transistor $NM_{3a}$ is connected to a fourth node ④. A power supply voltage $V_{DD}$ is connected to the drain terminal of the first transistor $NM_{3a}$, and the source terminal of the first transistor $NM_{3a}$ is connected to a second node ②.

The one end of a third capacitor $C_{32+}$ is connected to a second node ②, and the other end of the third capacitor $C_{32+}$ outputs an in-phase output signal $V_{OUT+}$.

The one end of a second capacitor $C_{31-}$ is connected to a first node ①, and the other end of the second capacitor $C_{31-}$ is connected to a fifth node 5.

The gate terminal of the second transistor $NM_{3b}$ is connected to a fifth node 5. The drain terminal of the second transistor $NM_{3b}$ is connected to a third node ③, and the source terminal of the second transistor $NM_{3b}$ is connected to the ground.

The one end of the fourth capacitor $C_{32-}$ is connected to a third node ③, and the other end of the fourth capacitor $C_{32-}$ outputs an inverse-phase output signal $V_{OUT-}$.

Hereinafter, the operations of the hybrid balun apparatus 300 according to the present embodiment will be described with reference to FIGS. 4B and 4C.

When an input signal $V_{IN}$ is applied to a first node ①, the supplied input signal $V_{IN}$ is applied simultaneously to the input terminal of the passive unit 310, the input terminal of the first active unit 320, and the input terminal of the second active unit 330.

When the input signal is applied to the one end of the primary coil of the transformer 311 of the passive unit 310, the secondary coil that is magnetically coupled to the primary coil becomes excited, and the output signal is generated at the secondary coil.

Therefore, the transformer 311 outputs the in-phase signal 322 that has an identical phase compared to the input signal $V_{IN}$ to a second node ② through the in-phase output terminal of the secondary coil along an in-phase signal path 322a.

Also, the transformer 311 outputs an inverse-phase signal 332 that has an inverse phase compared to the input signal $V_{IN}$ to the third node ③ through an inverse-phase output terminal of the secondary coil along an inverse-phase signal path 332a.

However, the transformer 311 usually causes signal power loss during the signal conversion process from the single-ended input signal $V_{IN}$ to the differential signals 322 and 332.

The transformer 311 has such a characteristic because a coupling coefficient (k-factor) of the transformer 311 is typically less than 1.

In order to overcome such a drawback, the hybrid balun apparatus 300 according to the present embodiment comprises the first active unit 320 for generating an in-phase compensating signal 321 that compensates the in-phase signal 322 of the transformer 311, and a second active unit 330 for generating an inverse-phase compensating signal 331 that compensates the inverse-phase signal 332 of the transformer 311.

The first active unit 320 removes the DC component of the input signal $V_{IN}$ applied to the input terminal of the first active unit 320 by using the first capacitor $C_{31+}$.

The DC-removed input signal $V_{IN}$ is applied to the gate terminal of the first transistor $NM_{3a}$ along the in-phase compensating signal path 321a. And the in-phase compensating signal 321 is generated with an identical phase and a smaller amplitude compared to the input signal $V_{IN}$, and supplied to the second node ②.

That is, the in-phase output signal $V_{OUT+}$ is formed of the sum of the in-phase signal 322, which is provided through the in-phase signal path 322a of the passive unit 310, and the in-phase compensating signal 321, which is provided through the in-phase compensating signal path 321a of the first active unit 320.

According to the structure described above, the loss of the input signal $V_{IN}$ at the passive unit 10 is compensated by the first active unit 320 in the hybrid balun apparatus 300 according to the present embodiment.

Using same method, the second active unit 330 removes the DC component of the input signal $V_{IN}$ supplied to the input terminal of the second active unit 330 by using the second capacitor $C_{31-}$.

The DC-removed input signal $V_{IN}$ is applied to the gate terminal of the second transistor $NM_{3b}$ along the inverse-phase compensating signal path 331a. And the inverse-phase compensating signal 331 is generated with an inverse-phase and a smaller amplitude compared to the input signal $V_{IN}$, and supplied to the third node ③.

That is, the inverse-phase output signal $V_{OUT-}$ is formed of the sum of the inverse-phase signal 332, which is provided through the inverse-phase signal path 332a of the passive unit 310, and the inverse-phase compensating signal 331, which is provided through the inverse-phase compensating signal path 331a of the second active unit 330.

According to the structure described above, the loss of the input signal $V_{IN}$ at the passive unit 310 is compensated by the second active unit 330 in the hybrid balun apparatus 300 according to the present embodiment.

Also, the hybrid balun apparatus 300 according to the present embodiment has less power consumption, wideband characteristic, and better linearity compared to the conventional active balun due to its simple circuit structure and no resonating element. Also, the hybrid balun apparatus 300 according to the present embodiment has higher power gain and lower noise factor compared to the conventional passive balun due to the active compensating parts.

Also, the first active unit 320 and the second active unit 330 can be embodied as a fully symmetric differential amplifier circuit that provides the in-phase compensating signal 321 and the inverse-phase compensating signal 331 by differentially amplifying the input signal $V_{IN}$.

Table 1 compares the characteristics of a passive balun circuit and a hybrid balun apparatus 300 according to the present invention.

TABLE 1

|  | Passive | Hybrid |
|---|---|---|
| Operating frequency | 2.4 GHz | 2.4 GHz |
| Gain error/Phase error | 0.07 dB/ 2.79° | 0.57 dB/1.93° |
| Maximum gain (+S11 < −18 dB) | −2.75 dB | 0.45 dB |
| Minimum noise factor (*S11 < −18 dB) | 2.75 dB | 2.4 dB |
| Input 1-dB compression point (P1dB)/Input referred third-order intercept point (IIP3) | Infinity | +12 dBm/+15.4 dBm |
| DC power consumption | 0 mW | 1.2 V × 0.68 mA = 0.82 mW |

Table 1 shows the representative results of prototype measurements of a hybrid balun according to the present embodiment that is manufactured using a 0.18 μm radio frequency (RF) complementary metal-oxide semiconductor (CMOS) manufacturing process. As shown in Table 1, the hybrid balun apparatus according to the present invention has about 0.57 dB amplitude error and about 1.93° phase error at 2.4 GHz. The gain of the hybrid balun is improved as much as about 3.2 dB, and the noise factor is improved as much as about 0.35 dB compared to the conventional passive balun.

Also, the hybrid balun apparatus 300 according to the present embodiment consumes about 0.68 mA at about 1.2V, and the overall power consumption is about 0.82 mW.

A bias voltage $V_{BIAS+}$ is supplied to the gate terminal of the first transistor $NM_{3a}$ which is a fourth node (4), and a bias voltage $V_{BIAS-}$ is supplied to the gate terminal of the second transistor $NM_{3b}$ which is a fifth node (5).

As shown in FIG. 4B, the DC bias voltage $V_{BIAS}$ is supplied to a sixth node (6) in order to bias the first transistor $NM_{3a}$ and the second transistor $NM_{3b}$ at an appropriate point to generate a proper gain.

The third capacitor $C_{32+}$ blocks the DC not to be included in the in-phase output signal $V_{OUT+}$, and the fourth capacitor $C_{32-}$ blocks the DC not to be included in the inverse-phase output signal $V_{OUT-}$.

The fifth capacitor $C_{33}$ is used for AC-ground for RF signals.

The DC bias current flows through the first transistor $NM_{3a}$ and the second transistor $NM_{3b}$. Since the bias current flows along the current path 312, the DC current is reused by the first active unit 320 and the second active unit 330.

Figure 5:
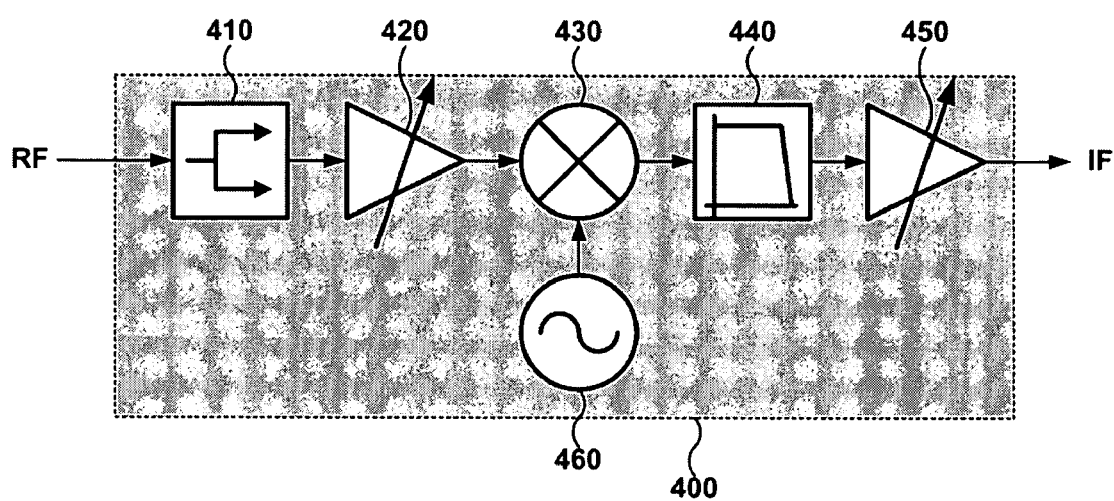
FIG. 5 shows a receiver comprising the hybrid balun apparatus shown in FIGS. 4A through 4C.

FIG. 5 shows a receiver comprising a hybrid balun apparatus in accordance with an embodiment of the present invention.

As shown in FIG. 5, the receiver 400 according to the present embodiment comprises the hybrid balun apparatus 410, a variable-gain low-noise amplifier 420, a down-conversion mixer 430, a low-pass filter 440, a variable gain amplifier 450 and an oscillator 460.

Table 2 compares the overall noise factors and gains of a receiver 400 comprising the hybrid balun apparatus 410 shown in FIG. 3 through FIG. 4C and a receiver 400 with a conventional passive balun 100 instead of the hybrid balun apparatus 410.

As shown in Table 2, the hybrid balun apparatus 410 improves the overall noise factor of the receiver as much as about 1.8 dB and the overall gain of the receiver as much as 3.2 dB.

Therefore, the improvement of the noise factor significantly improves the receiving sensitivity of the receiver.

TABLE 2

| | | Balun | Low-noise amplifier | Frequency down-converter | Overall performance of receiver |
|---|---|---|---|---|---|
| Passive balun | Noise factor (dB) | 2.75 | 2 | 10 | 6.7 |
| | Gain (dB) | −2.75 | 10 | 5 | 12.25 |
| Hybrid balun | Noise factor (dB) | 2.4 | 2 | 10 | 4.88 |
| | Gain (dB) | 0.45 | 10 | 5 | 15.45 |

As described above, the hybrid balun apparatus provides very symmetric differential outputs over a wideband, consumes less DC power, lowers the noise factor, enhances the signal gain, and hardly suffers the linearity problems according to the structure of the present invention.

Also, the receiving band of the balun apparatus becomes broader compared to the conventional active balun apparatus.

Furthermore, if the balun apparatus according to the present invention is applied into the receiver, the overall noise factor is lowered, the overall signal gain is improved, the DC power consumption is reduced, and the receiving band becomes wider.

The foregoing exemplary embodiments and aspects of the invention are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A hybrid balun apparatus, comprising:
    a passive unit for receiving an input signal, and outputting an in-phase signal having an identical phase compared to the input signal and an inverse-phase signal having an inverse phase compared to the input signal;
    a first active unit for compensating the in-phase signal of the passive unit corresponding to the input signal;
    a second active unit for compensating the inverse-phase signal of the passive unit corresponding to the input signal; and
    wherein the first active unit and the second active unit are combined together to differentially amplify the input signal.

2. A hybrid balun apparatus, comprising:
    a passive unit which comprises: a primary coil where an input signal is applied, and a secondary coil for outputting an in-phase signal having an identical phase compared to the input signal and an inverse-phase signal having inversed phase compared to the input signal through an in-phase output terminal and an inverse-phase output terminal, respectively, in response to the input signal applied to the primary coil;
    a first active unit which comprises a first transistor for outputting an in-phase compensating signal having an identical phase compared to the in-phase signal in response to the input signal;
    a second active unit which comprises a second transistor for outputting an inverse-phase compensating signal having an identical phase compared to the inverse-phase signal in response to the input signal; and
    wherein the first transistor is configured as a source-follower amplifier, and the second transistor is configured as a common-source amplifier.

3. The hybrid balun as claimed in claim 2, wherein the secondary coil comprises a tap terminal.

4. The hybrid balun as claimed in claim 3, a fifth capacitor is electrically connected from a ground terminal to the tap terminal.

5. The hybrid balun as claimed in claim 2, wherein the in-phase signal output terminal of the secondary coil and the output terminal of the first transistor are connected to the in-phase output terminal, and the inverse-phase signal output terminal of the secondary coil and the output terminal of the second transistor are connected to the inverse-phase output terminal.

6. The hybrid balun as claimed in claim 2, wherein the first active unit further comprises a first capacitor that blocks a direct current component of the input signal, and the second active unit further comprises a second capacitor that blocks a direct current component of the input signal.

7. The hybrid balun as claimed in claim 2, wherein a third capacitor is electrically connected to the in-phase output terminal in series and a fourth capacitor is electrically connected to the inverse-phase output terminal in series.

8. A receiver comprising a hybrid balun apparatus as claimed in claim 2.

9. A hybrid balun apparatus comprising:
    a passive unit which comprises: a primary coil where an input signal is applied, and a secondary coil for outputting an in-phase signal having an identical phase compared to the input signal and an inverse-phase signal having an inversed phase compared to the input signal through an in-phase output terminal and an inverse-phase output terminal, respectively, in response to the input signal applied to the primary coil;

a first active unit which comprises a first transistor for outputting an in-phase compensating signal having an identical phase compared to the in-phase signal in response to the input signal;

a second active unit which comprises a second transistor for outputting an inverse-phase compensating signal having an identical phase compared to the inverse-phase signal in response to the input signal; and wherein the first active unit and the second active unit are combined together to differentially amplify the input signal.

10. A receiver comprising a hybrid balun apparatus as claimed in claim 9.

* * * * *